US012671422B2

(12) United States Patent
Pulcini et al.

(10) Patent No.: US 12,671,422 B2
(45) Date of Patent: Jun. 30, 2026

(54) OUTPUT SWITCHING SIGNAL USING CAPACITIVE ELEMENT DISCHARGING

(71) Applicant: Infineon Technologies AG, Neubiberg (DE)

(72) Inventors: Lorenzo Pulcini, Savona (IT); Paolo Del Croce, Villach (AT); Andrea Baschirotto, Tortona (IT)

(73) Assignee: Infineon Technologies AG, Neubiberg (DE)

( * ) Notice: Subject to any disclaimer, the term of this patent is extended or adjusted under 35 U.S.C. 154(b) by 14 days.

(21) Appl. No.: 18/797,108

(22) Filed: Aug. 7, 2024

(65) Prior Publication Data

US 2026/0045952 A1      Feb. 12, 2026

(51) Int. Cl.
H03K 21/10 (2006.01)
H03L 7/087 (2006.01)

(52) U.S. Cl.
CPC ............. H03K 21/10 (2013.01); H03L 7/087 (2013.01)

(58) Field of Classification Search
CPC .. H02M 3/156; H02M 1/0025; H02M 3/1584; H02M 3/157; H02M 3/158; H02M 3/155; H02M 3/145; H02M 3/10; H02M 3/04; H02M 3/02; H02M 3/00
See application file for complete search history.

(56) References Cited

U.S. PATENT DOCUMENTS 11,979,087 B2 *    5/2024   Li ............................ H02J 7/345

* cited by examiner

*Primary Examiner* — Diana J. Cheng
(74) *Attorney, Agent, or Firm* — Shumaker & Sieffert, P.A.

(57)                    ABSTRACT

A circuit for generating an output switching signal includes switching circuitry and comparison circuitry. The switching circuitry is configured to configured to discharge a first capacitive element in response to detecting a first phase of an input switching signal and connect the first capacitive element and a second capacitive element in parallel in response to detecting a second phase of the input switching signal. The comparison circuitry is configured to generate the output switching signal based on a voltage at the second capacitive element.

20 Claims, 8 Drawing Sheets

500

802

DISCHARGE FIRST CAPACITIVE ELEMENT IN RESPONSE DETECTING FIRST PHASE OF INPUT SWITCHING SIGNAL

804

CONNECT FIRST CAPACITIVE ELEMENT AND SECOND CAPACITIVE ELEMENT IN PARALLEL IN RESPONSE DETECTING SECOND PHASE OF THE INPUT SWITCHING SIGNAL

806

GENERATE OUTPUT SWITCHING SIGNAL BASED ON VOLTAGE AT FIRST CAPACITIVE ELEMENT

OUTPUT SWITCHING SIGNAL USING CAPACITIVE ELEMENT DISCHARGING

TECHNICAL FIELD

This disclosure relates to circuits and techniques for generating an output switching signal.

BACKGROUND

A clock generator generates a switching signal to support operation of a circuit. For example, a clock generator generates a clock signal to synchronize an operation of software and/or hardware components of a circuit.

SUMMARY

In general, this disclosure is directed to techniques for a low power frequency divider. Rather than relying solely on digital frequency dividers (e.g., cascaded D-Flip Flops), techniques described herein use an analog frequency divider. For example, switching circuitry may be configured to discharge a first capacitive element in response to detecting a first phase (e.g., a logical 0) of an input switching signal and connect the first capacitive element and a second capacitive element ($C_{1b}$) in parallel in response to detecting a second phase (e.g., a logical 1) of the input switching signal. In this example, comparison circuitry generates the output switching signal based on a voltage the second capacitive element. For instance, the comparison circuitry may generate the output signal with a first phase (e.g., a logical 1) when the voltage at the second capacitive element is greater than a comparison voltage and to generate the output signal with a second phase (e.g., a logical 0) when the voltage at the second capacitive element is less than the comparison voltage. In this way, analog components may generate the output switching signal with a reduced frequency, which may reduce an amount of power consumed to generate the output switching frequency compared to systems that solely rely on digital frequency dividers.

In one example, the disclosure describes a circuit for generating an output switching signal, the circuit including switching circuitry and comparison circuitry. The switching circuitry is configured to discharge a first capacitive element in response to detecting a first phase of an input switching signal and connect the first capacitive element and a second capacitive element in parallel in response to detecting a second phase of the input switching signal. The comparison circuitry is configured to generate the output switching signal based on a voltage at the second capacitive element.

In another example, this disclosure describes a system for generating an output switching signal including a first capacitive element, a second capacitive element, switching circuitry, and comparison circuitry. The switching circuitry is configured to discharge the first capacitive element in response to detecting a first phase of an input switching signal and connect the first capacitive element and the second capacitive element in parallel in response to detecting a second phase of the input switching signal. The comparison circuitry is configured to generate the output switching signal based on a voltage at the second capacitive element.

In one example, this disclosure describes a method for generating an output switching signal, the method including discharging a first capacitive element in response to detecting a first phase of an input switching signal, connecting the first capacitive element and a second capacitive element in parallel in response to detecting a second phase of the input switching signal, and generating the output switching signal based on a voltage at the second capacitive element.

Details of these and other examples are set forth in the accompanying drawings and the description below. Other features, objects, and advantages will be apparent from the description and drawings, and from the claims.

DETAILED DESCRIPTION

Figure 1:
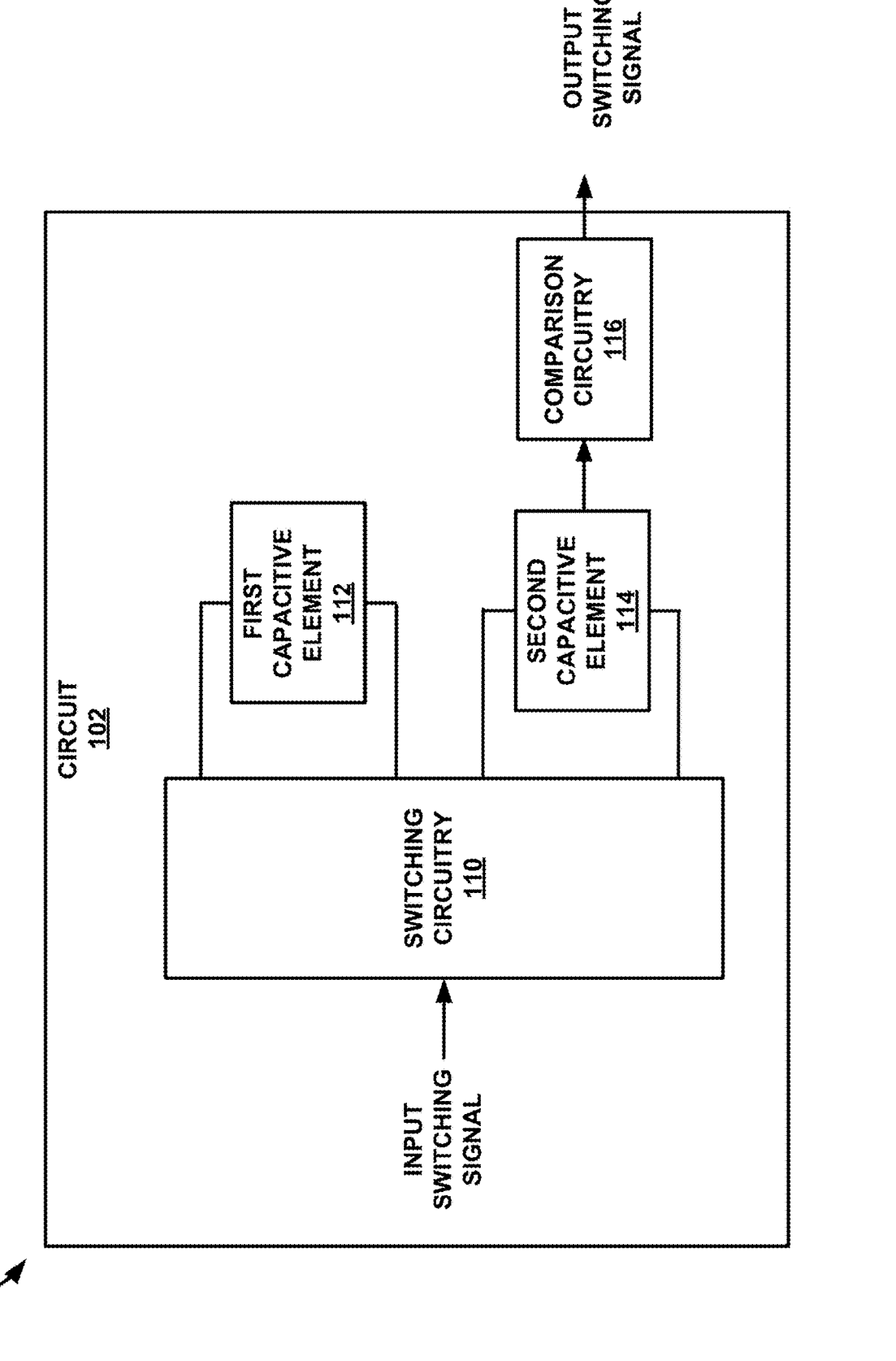
FIG. 1 is a block diagram illustrating an example first system for generating an output switching signal, in accordance with one or more techniques of this disclosure.

FIG. 1 is a block diagram illustrating an example first system for generating an output switching signal, in accordance with one or more techniques of this disclosure. As illustrated in the example of FIG. 1, system 100 may include circuit 102. Circuit 102 includes switching circuitry 110, first capacitive element 112, second capacitive element 114, and comparison circuitry 116.

First capacitive element 112 and second capacitive element 114 may each include an electrical component configured to store electrical energy in an electric field. Examples of an electrical component configured to store electrical energy in an electric field may include, but are not limited to, ceramic capacitors, film capacitors, electrolytic capacitors (e.g., aluminum, tantalum, niobium, or the like), super capacitors (e.g., double layer, pseudocapacitors, hybrid capacitors), mica capacitors, or the like. Although first capacitive element 112 and second capacitive element 114 may be each described as an element, first capacitive element 112 and/or second capacitive element 114 may each be an array of capacitive elements. For instance, first capacitive element 112 may be an array of capacitive elements coupled in parallel and/or series. Each one of the capacitive elements may be included in a single chip implementing circuit 102 (e.g., a monolithic integrated circuit). In some examples, however, one or more capacitive element may be formed using one or more discrete components (e.g., a capacitor array) that are discrete from other components of circuit 102.

Switching circuitry 110 may be configured to electronically connect nodes of first capacitive element 112 and nodes of second capacitive element 114 based on an input switching signal. For example, switching circuitry 110 may discharge first capacitive element 112 in response to detecting a first phase (e.g., a logical 0 or a logical 1) of the input switching signal. For instance, switching circuitry 110 may couple nodes (e.g., a positive node and negative node) of first capacitive element 112 to a supply node (e.g., a voltage node or a ground node) in response to detecting the first phase of the input switching signal.

Switching circuitry 110 may connect first capacitive element 112 and second capacitive element 114 in parallel in response to detecting a second phase (e.g., a logical 1 or a logical 0) of the input switching signal. Connecting first capacitive element 112 and second capacitive element 114 in parallel transfers a charge stored at second capacitive element 114 to first capacitive element 112. As described in further detail with respect to FIG. 6, switching circuitry 110 discharging first capacitive element 112 and connecting first capacitive element 112 and second capacitive element 114 in parallel may cause a voltage at second capacitive element 114 to have an exponential transient behavior.

Examples of switching elements may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. Examples of BJTs may include, but are not limited to, PNP, NPN, heterojunction, or any other type of BJT, or any combination of the same. Switching elements may be high-side or low-side switching elements.

Comparison circuitry 116 may be configured to generate the output switching signal based on a voltage at second capacitive element 114. For example, comparison circuitry 116 may generate the output switching signal to indicate a first phase (e.g., a logical 1 or a logical 0) when the voltage at second capacitive element 114 is greater than a reference voltage (e.g., a preconfigured voltage). In this example, comparison circuitry 116 may generate the output switching signal to indicate a second phase when the voltage at second capacitive element 114 is not greater than the reference voltage. In this way, system 100 may generate the output switching signal with a lower frequency than the input switching signal, which may reduce an amount of power consumed by system 100 compared to systems relying solely on digital frequency dividers (e.g, cascaded D-Flip Flops) to generate the output switching signal.

Figure 2B:
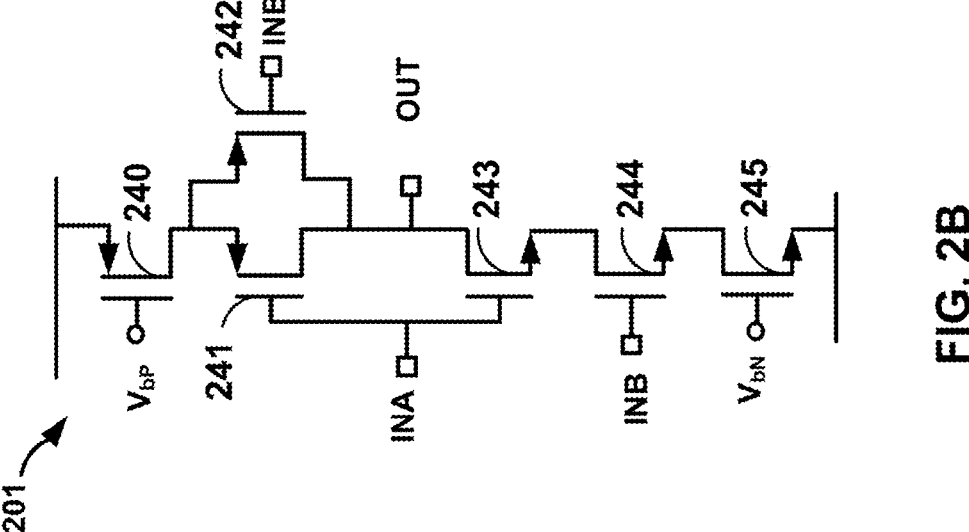
FIG. 2B is a circuit diagram illustrating an example current limited NAND gate for reducing power consumption of a digital frequency divider, in accordance with one or more techniques of this disclosure.
Figure 2A:
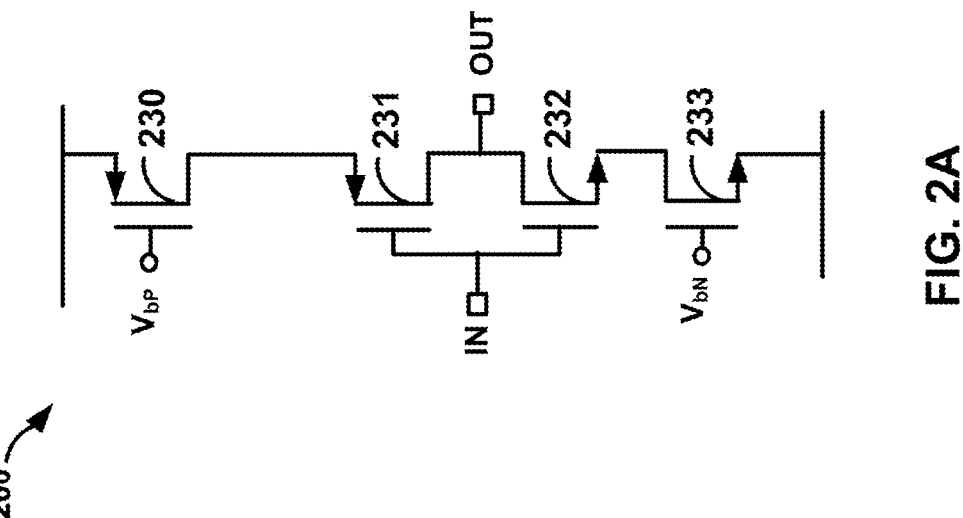
FIG. 2A is a circuit diagram illustrating an example current limited Complementary metal-oxide-semiconductor (CMOS) inverter, in accordance with one or more techniques of this disclosure.

FIG. 2A is a circuit diagram illustrating an example current limited Complementary metal-oxide-semiconductor (CMOS) inverter 200, in accordance with one or more techniques of this disclosure. As shown, CMOS inverter 200 includes transistors 230-233.

Power consumption is an important parameter for high-efficiency or battery-operated systems, such as, for example, automotive systems when the car is turned off. In some systems, several blocks (e.g., a frequency divider) may remain active and consume a significant amount of power, for example, when a car is turned off. To help to reduce power consumption, CMOS inverter 200 may limit a current during a cross-over. Examples described herein using a D-Flip Flop may optionally include current limiting devices (e.g., CMOS inverter 200).

FIG. 2B is a circuit diagram illustrating an example current limited NAND gate 201 for reducing power consumption of a digital frequency divider, in accordance with one or more techniques of this disclosure. As shown, NAND gate 201 includes transistors 240-245, which may be configured to limit a current during a cross-over to help to reduce power consumption. Examples described herein using a D-Flip Flop may optionally include current limiting devices (e.g., NAND gate 201).

Figure 3:
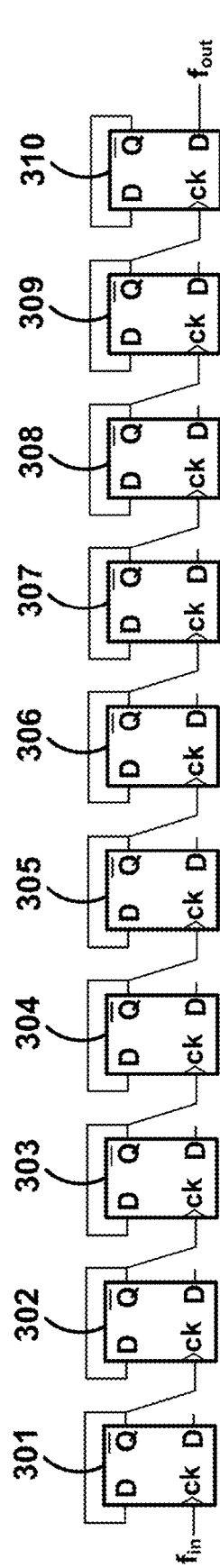
FIG. 3 is a block diagram illustrating an example digital frequency divider, in accordance with one or more techniques of this disclosure.

FIG. 3 is a block diagram illustrating an example digital frequency divider 300, in accordance with one or more techniques of this disclosure. As shown, digital frequency divider 300 includes cascaded D-Flip Flops 301-310. D-Flip Flops 301-310 may use one or more of the current-limited blocks of FIG. 2A or FIG. 2B. Examples described herein using an analog digital frequency divider may optionally include a digital frequency divider. For example, the output switching signal of circuit 102 of FIG. 1 may be used as a clock input (e.g., $f_{in}$) of D-Flip Flop 301. While the example of FIG. 3 illustrates ten D-Flip Flops, other examples of a digital frequency divider may include less than ten or more than ten D-Flip Flops.

Figure 4:
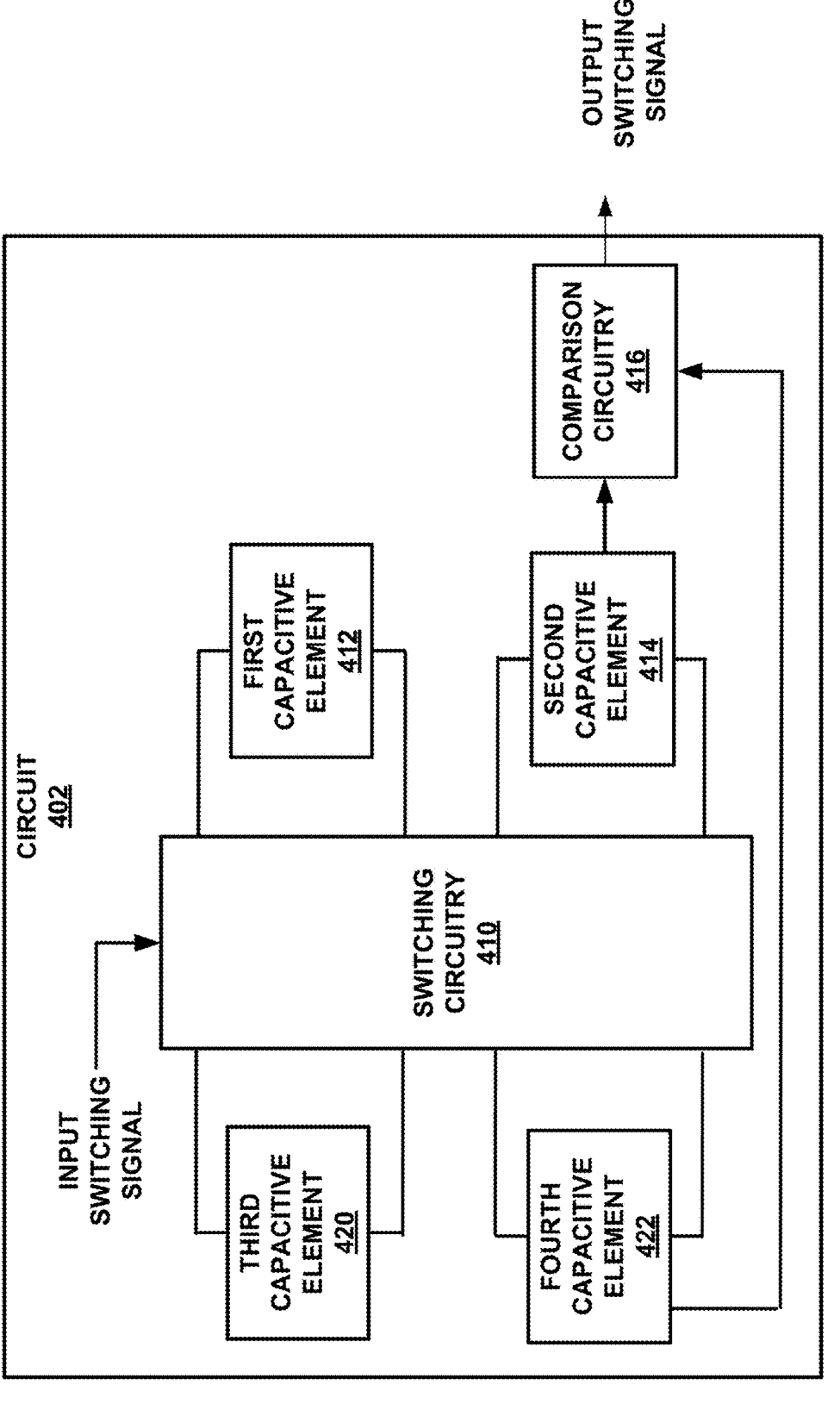
FIG. 4 is a block diagram illustrating an example second system for generating an output switching signal, in accordance with one or more techniques of this disclosure.

FIG. 4 is a block diagram illustrating an example second system for generating an output switching signal, in accordance with one or more techniques of this disclosure. As illustrated in the example of FIG. 4, system 400 may include circuit 402. Circuit 402 includes switching circuitry 410, first capacitive element 412, second capacitive element 414, and comparison circuitry 416, which may be similar to switching circuitry 110, first capacitive element 112, second capacitive element 114, and comparison circuitry 116 of FIG. 1. Moreover, circuit 402 may further include third capacitive element 420 and fourth capacitive element 422.

Similar to switching circuitry 110 of FIG. 1, switching circuitry 410 may discharge first capacitive element 412 in response to detecting a first phase (e.g., a logical 0 or a logical 1) of the input switching signal. For instance, switching circuitry 110 may couple nodes (e.g., a positive node and negative node) of first capacitive element 112 to a supply node (e.g., a voltage node or a ground node) in response to detecting the first phase of the input switching signal. Switching circuitry 110 may connect first capacitive element 412 and second capacitive element 414 in parallel in response to detecting a second phase (e.g., a logical 1 or a logical 0) of the input switching signal. Switching circuitry 410 discharging first capacitive element 412 and connecting first capacitive element 412 and second capacitive element 414 in parallel may cause a voltage at second capacitive element 414 to have an exponential behavior (e.g., exponentially increasing or decreasing).

In the example of FIG. 4, switching circuitry 410 may discharge third capacitive element 420 in response to detecting the first phase of the input switching signal. In this example, switching circuitry 410 may connect third capacitive element 420 and fourth capacitive element 422 in parallel in response to detecting the second phase of the input switching signal. Switching circuitry 410 discharging third capacitive element 420 and connecting third capacitive element 420 and fourth capacitive element 422 in parallel may cause a voltage at fourth capacitive element 422 to have an exponential behavior (e.g., exponentially decreasing or increasing). In this way, a comparison of the voltage at second capacitive element 414 and the voltage at fourth capacitive element 422 depends only on capacitor ratio and is independent of both absolute capacitance and source voltage (e.g., a voltage to charge second capacitive element 141 and/or fourth capacitive element 422), which may help to improve an accuracy of the system 400 of compared to systems that rely on a reference voltage (e.g., a predefined voltage).

Comparison circuitry 416 may generate the output signal based on the voltage at second capacitive element 414 and further based on a voltage at fourth capacitive element 422. For example, comparison circuitry 416 may generate the output switching signal to indicate a first phase when the voltage at second capacitive element 414 is greater than the voltage at fourth capacitive element 422. In this example, comparison circuitry 416 may generate the output switching signal to indicate a second phase when the voltage at second capacitive element 414 is not greater than the voltage at fourth capacitive element 422.

Figure 5:
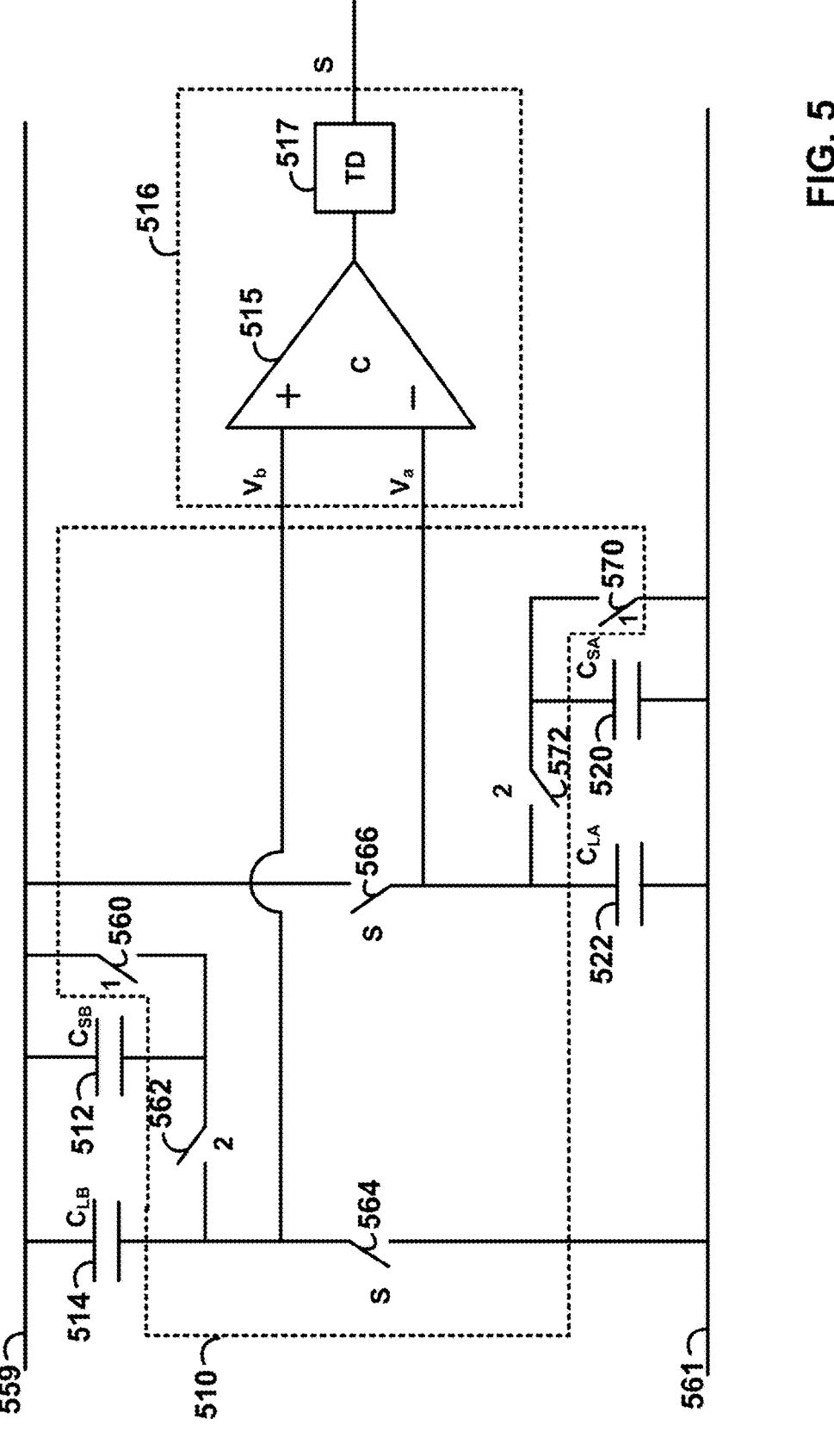
FIG. 5 is a circuit diagram illustrating the example second system of FIG. 4, in accordance with one or more techniques of this disclosure.

FIG. 5 is a circuit diagram illustrating the example second system of FIG. 4, in accordance with one or more techniques of this disclosure. Circuit 500 may represent an analog frequency divider. In the example of FIG. 5, circuit 500 may include first supply node 559 (e.g., a voltage node) and second supply node 561 (e.g., a ground or reference node), first capacitive element 512, second capacitive element 514, third capacitive element 520, fourth capacitive element 522, comparison circuitry 516, and time delay module 518. In the example of FIG. 5, switching circuitry 510 includes a first switching element 560, a second switching element 562, third switching element 570, fourth switching element 572, first sampling switching element 564 and second sampling switching element 566. Second capacitive element 514 and fourth capacitive element 522 may have a relatively large capacitance and may be referred to herein as "large capacitors" or simply as "$C_{LB}$," "$C_{LA}$," respectively. For example, second capacitive element 514 may have greater capacitance than first capacitive element 512. Similarly, fourth capacitive element 522 may have greater capacitance than third capacitive element 520.

As shown in FIG. 5, first capacitive element 512 includes a first node coupled to supply node 559 and a second node. Second capacitive element 514 includes a first node coupled to supply node 559 and a second node. In this example, first switching element 560 includes a first node coupled to supply node 559 and a second node coupled to a second node of first capacitive element 512. Second switching element 562 includes a first node coupled to the second node of first capacitive element 512 and a second node coupled to the second node of second capacitive element 514.

Switching circuitry 510, or more specifically, first sampling switching element 564 may be configured to charge second capacitive element 514 to a supply voltage (e.g., a voltage at supply node 559). Similarly, switching circuitry 510, or more specifically, second sampling switching element 566 may be configured to charge fourth capacitive element 522 to the supply voltage (e.g., a voltage at supply node 559). For example, in response to a sampling phase ('S'), first sampling switching element 564 may charge second capacitive element 514 and second sampling switching element 566 may charge fourth capacitive element 522. The sampling phase is discussed in further details with respect to FIG. 6.

In response to detecting the first phase ('1') of an input switching signal, switching circuitry 510, or more specifically, first switching element 560 may discharge the first capacitive element 512. For example, in response to detecting the first phase ('1') of an input switching signal, first switching element 560 may connect both the first node of first capacitive element 512 and the second node of first capacitive element 512 to supply node 559. For example, first switching element 560 may be configured to operate in an open state during the second phase of the input switching signal and to operate in a closed state during the first phase of the input switching signal. In this example, second switching element 562 may be configured to operate in a closed state during the second phase ('2') of the input switching signal and to operate in an open state during the first phase of the input switching signal.

Similarly, third capacitive element 520 includes a first node coupled to supply node 561 and a second node. Fourth capacitive element 522 includes a first node coupled to supply node 561 and a second node. In this example, third switching element 570 includes a first node coupled to supply node 561 and a second node coupled to a second node of third capacitive element 520. Fourth switching element 572 includes a first node coupled to the second node of first capacitive element 512 and a second node coupled to the second node of second capacitive element 514. While the example of FIG. 5, refers to the first and second capacitive elements as being coupled to supply node 559 (e.g., the voltage node) in some examples, the first and second capacitive elements are coupled to supply node 561 (e.g., a ground or reference node).

In response to detecting the first phase of an input switching signal, switching circuitry 510, or more specifically, third switching element 570 may connect both the first node of third capacitive element 520 and the second node of third capacitive element 520 to supply node 561. For example, third switching element 570 may be configured to operate in an open state during the second phase of the input switching signal and to operate in a closed state during the first phase of the input switching signal.

In response to detecting a second phase of the input switching signal, switching circuitry 510, or more specifically, fourth switching element 572 may connect the first capacitive element and a second capacitive element in parallel. For example, fourth switching element 572 may be configured to operate in a closed state during the second phase of the input switching signal and to operate in an open state during the first phase of the input switching signal.

Comparison circuitry 516 may generate the output signal based on the voltage at second capacitive element 514 and further based on a voltage at fourth capacitive element 522. For example, comparison circuitry 516 may generate the output switching signal to indicate a first phase when the voltage at second capacitive element 514 is greater than the voltage at fourth capacitive element 522. In this example, comparison circuitry 516 may generate the output switching signal to indicate a second phase when the voltage at second capacitive element 514 is not greater than the voltage at fourth capacitive element 522. Comparison circuitry 516 may include comparator 515 and time delay module 617. Time delay module 617 may reset the output switching signal after a time delay (e.g., the inverse of a frequency of the input switching signal).

Figure 6:
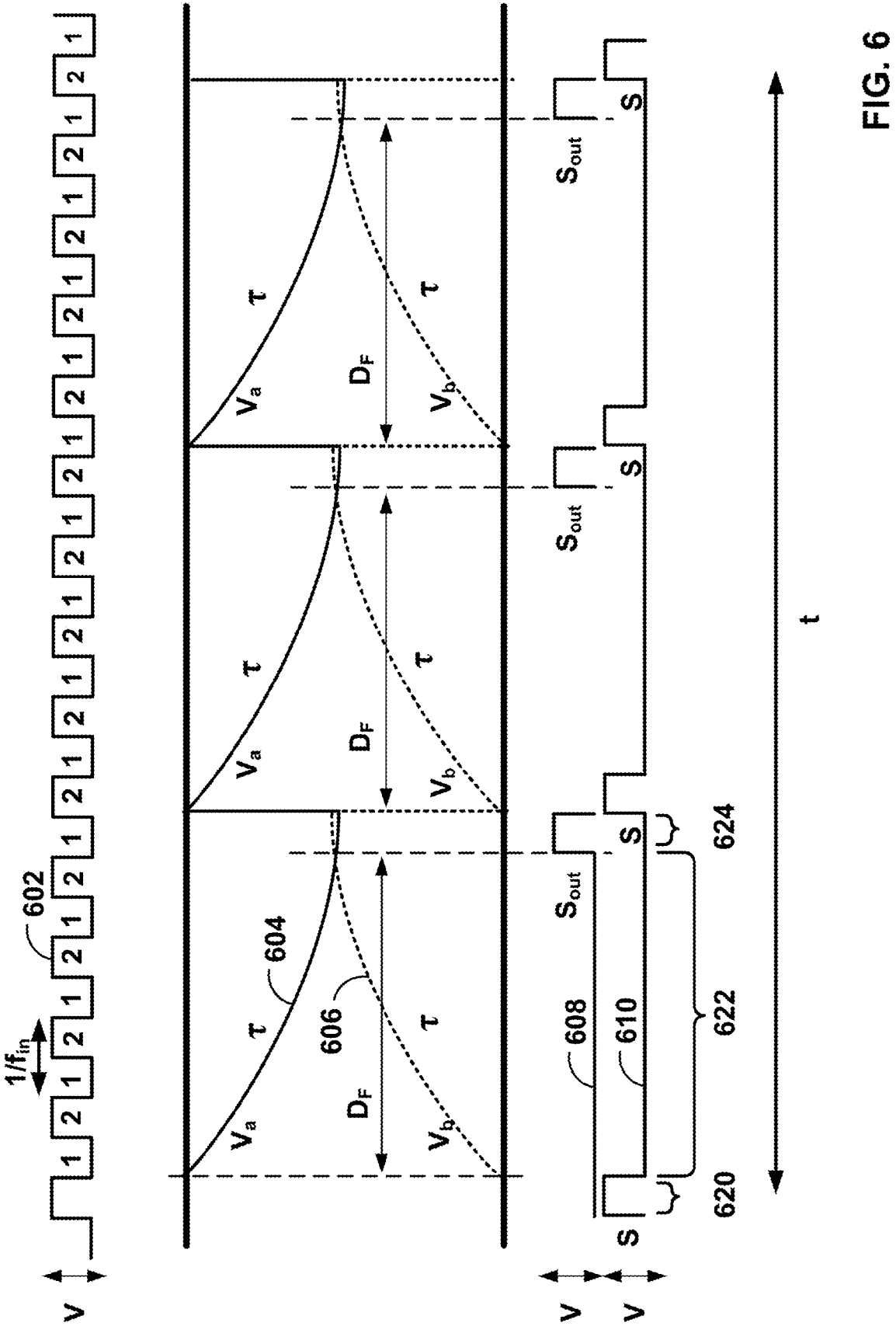
FIG. 6 is a graph chart illustrating an input switching signal, a voltage at a second capacitive element, a voltage at a fourth capacitive element, an output switching signal, and a sampling signal, in accordance with one or more techniques of the disclosure.

FIG. 6 is a graph chart illustrating an input switching signal 602, a voltage at a second capacitive element 604 (V$_b$(t) with reference to FIG. 5), a voltage at a fourth capacitive element 606 (e.g., V$_a$(t) with reference to FIG. 5), an output switching signal 608, and a sampling signal 610, in accordance with one or more techniques of the disclosure. The horizontal axis (i.e., x-axis or abscissa axis) represents time (t).

FIG. 6 is discussed with reference to FIGS. 1-5 for example purposes only. Circuit 500 may operate in a sampling phase 620 in response to detecting a pulse (e.g., a logical '1' or a voltage that exceeds a threshold value in sampling signal 610. During sampling phase 620, first sampling switching element 564 may pre-charge second capacitive element 514. For example, first switching element 560 may connect first capacitive element 512 to supply node 559 (e.g., VDD) during the sampling phase 620. Second switching element 562 may refrain from connecting first capacitive element 512 in parallel with second capacitive element 514 during the sampling phase 620. For instance, second switching element 562 may operate in an open state during the sampling phase 620.

Similarly, second sampling switching element 566 may pre-charge fourth capacitive element 522. In some examples, third switching element 570 may connect third capacitive element 520 to supply node 561 (e.g., GND) during the sampling phase 620. Fourth switching element 572 may refrain from connecting third capacitive element 520 in parallel with fourth capacitive element 522 during the sampling phase 620. For instance, fourth switching element 572 may operate in an open state during the sampling phase 620.

After the sampling phase 620 and during an analog frequency divider phase 622, first sampling switching element 564 and second sampling switching element 566 may be turned off (e.g., operated in an open state) until another sampling phase (e.g., sampling phase 624). During the analog frequency divider phase 622, switching circuitry 510 may operate based on a first phase ('1') and a second phase ('2') of input switching signal 602 (e.g., f$_{in}$). For instance, a sequence of clock phases 1 and 2 at frequency f$_{in}$ of input switching signal 602 may control the switches of switching circuitry 510 for a next operation phase, as follows. As shown, there may be multiple first phase and second phase operations during analog frequency divider phase 622. FIG. 6 illustrates an analog frequency divider phase 622 with four first phases and four second phases for examples purposes only. In some examples, analog frequency divider phase 622 may include more or less than four first phases and/or analog frequency divider phase 622 may include more or less than four second phases.

During the first phase of input switching signal 602, switching circuitry 510 may discharge first capacitive element 512 and third capacitive element 520 (e.g., C$_{Sa,b}$). For example, first switching element 560 may connect both the first node of first capacitive element 512 and the second node of first capacitive element 512 to supply node 559 (e.g., V$_{DD}$) during the first phase ('1') of input switching signal 602. Similarly, third switching element 570 may connect both the first node of third capacitive element 520 and the second node of third capacitive element 520 to supply node 561 (e.g., GND) during the first phase ('1') of input switching signal 602.

During the second phase of input switching signal 602, switching circuitry 510 may connect first capacitive element 512 and second capacitive element 514 in parallel. In this way, switching circuitry 510 may transfer a charge from second capacitive element 514 to first capacitive element 512, which will slightly discharge second capacitive element 514 and thus reduce a voltage at second capacitive element 514. Similarly, switching circuitry 510 may connect third capacitive element 520 and fourth capacitive element 522 in parallel. In this way, switching circuitry 510 may transfer a charge from fourth capacitive element 522 to third capacitive element 520, which will slightly discharge fourth capacitive element 522 and thus reduce a voltage at fourth capacitive element 522.

As shown in FIG. 6, the process of switching during the first phase of the input switching signal 602 and switching during the second phase of the input switching signal 602 may continue until comparison circuitry 516 generates a pulse at output signal. For example, during analog frequency divider phase 622, switching circuitry 510 may discharge second capacitive element 514 and fourth capacitive element 522 until a voltage at second capacitive element 514 (e.g., V$_b$) becomes higher than a voltage at fourth capacitive element 522 (V$_a$), and comparison circuitry 516 commutes and produces an output pulse (e.g., S$_{out}$).

The switched capacitors (C$_{Sa,b}$), first switching element 560 and third switching element 570, may operate as a "resistor" whose value can be approximated as R$_{eq}$=1/(f$_{in}$× C$_{Sa,b}$), where R$_{eq}$ represents an equivalent resistance of a switched capacitor, f$_{in}$ is a frequency of the input switching signal 602, and C$_{Sa,b}$ is an absolute capacitance of the switched capacitor. In this way the evolutions of the voltage at second capacitive element 514 (V$_a$(t)) and the voltage at fourth capacitive element 522 (V$_b$(t)) may have an exponential behavior and they can be written as Equations 1 and 2.

$$V_a(t) = V_{DD} \times \exp\left[-t/\left(T_S \times C_{La}/C_{Sa}\right)\right] \qquad \text{Equation 1}$$

where V$_a$(t) represents the voltage at fourth capacitive element 522, V$_{DD}$ represents a voltage at supply node 559, exp( ) represents a natural exponential function, t represents time, T$_s$ represents a time period (e.g., 1/f$_{in}$), C$_{La}$ represents an absolute capacitance of fourth capacitive element 522, and C$_{Sa}$ represents an absolute capacitance of third capacitive element 520.

$$V_b(t) = V_{DD} \times \left[1 - \exp\left[-t/\left(T_S \times C_{Lb}/C_{Sb}\right)\right]\right] \qquad \text{Equation 2}$$

where V$_b$(t) represents the voltage at second capacitive element 514, V$_{DD}$ represents a voltage at supply node 559, exp( ) represents a natural exponential function, t represents time, T$_s$ represents a time period (e.g., 1/f$_{in}$), C$_{Lb}$ represents an absolute capacitance of second capacitive element 514, and C$_{Sb}$ represents an absolute capacitance of first capacitive element 512.

The Switch point occurring at t$_x$ for V$_a$(t$_x$)=V$_b$(t$_x$) is given by Equation 3.

$$t_x = T_S \times \left(C_L/C_S\right) \times \ln(2) \qquad \text{Equation 3}$$

where tx is a switch point, T$_s$ is a time period (e.g., 1/f$_{in}$), C$_L$/C$_S$ is a capacitor ratio between the capacitance of second capacitive element 514 and first capacitive element 512 or between the capacitance of fourth capacitive element 522 and third capacitive element 520, and In(2) is the natural logarithm of 2. As shown in Equation 3, the switch point is independent of the voltage supplied at supply node 559 (e.g., $V_{DD}$).

At the switch point, comparison circuitry 516 may produce a pulse and the voltage on second capacitive element 514 and fourth capacitive element 522 (e.g., $C_{La,b}$) may be reset at sampling phase 624.

The sequence of output pulses of output switching signal 608 is at frequency $f_{out}$ as set forth in Equation 4.

$$f_{in} = f_{out} \times (C_L/C_S) \times \ln(2) = f_{out} \times D_F \qquad \text{Equation 4}$$

where $f_{in}$ is a frequency at input switching signal 602, $f_{out}$ is a frequency at output switching signal 608, $C_L/C_S$ is a capacitor ratio between the capacitance of second capacitive element 514 and first capacitive element 512 or between the capacitance of fourth capacitive element 522 and third capacitive element 520, In(2) is the natural logarithm of 2, and $D_F$ represents a frequency division factor.

The Frequency Division factor $D_F = f_{in}/f_{out}$ is then given by Equation 5.

$$D_F = (C_L/C_S) \times \ln(2) \qquad \text{Equation 5}$$

Assuming a scheme implements a frequency Division Factor ($D_F$) of 100, techniques described herein using an analog frequency divider using four capacitive elements (e.g., system 400 of FIG. 4 or circuit 500 of FIG. 5) may include one or more of the following advantage with respect to using only a cascade of D-Flip Flops as shown in FIG. 3. The frequency division factor is given by Equation 5 (e.g., $D_F = (C_L/C_S) \times \ln(2)$), results on the frequency division factor being independent on a voltage at a supply node (e.g., $V_{DD}$) and on capacitor absolute values. For instance, the frequency division factor depends on capacitor ratio and not absolute capacitance values, and therefore capacitance matching may be used.

Moreover, the analog frequency dividers illustrated in FIGS. 1, 3-5 may consume less power compared to systems relying solely on a cascade of D-Flip Flops. A power consumption of the analog frequency dividers illustrated in FIGS. 1, 3-5 may be due to the pre-charge of $C_L$ capacitors at the beginning of the slow period and to the stand-by comparator current. For example, a power consumption of the analog frequency dividers illustrated in FIGS. 1, 3-5 may be about 50% compared to systems using only a chain of D-Flip Flops. In another example benefit, the analog frequency dividers illustrated in FIGS. 1, 3-5 may use an area size in a circuit (e.g., a chip) that is much smaller than relying solely on a chain of D-Flip Flops.

Figure 7:
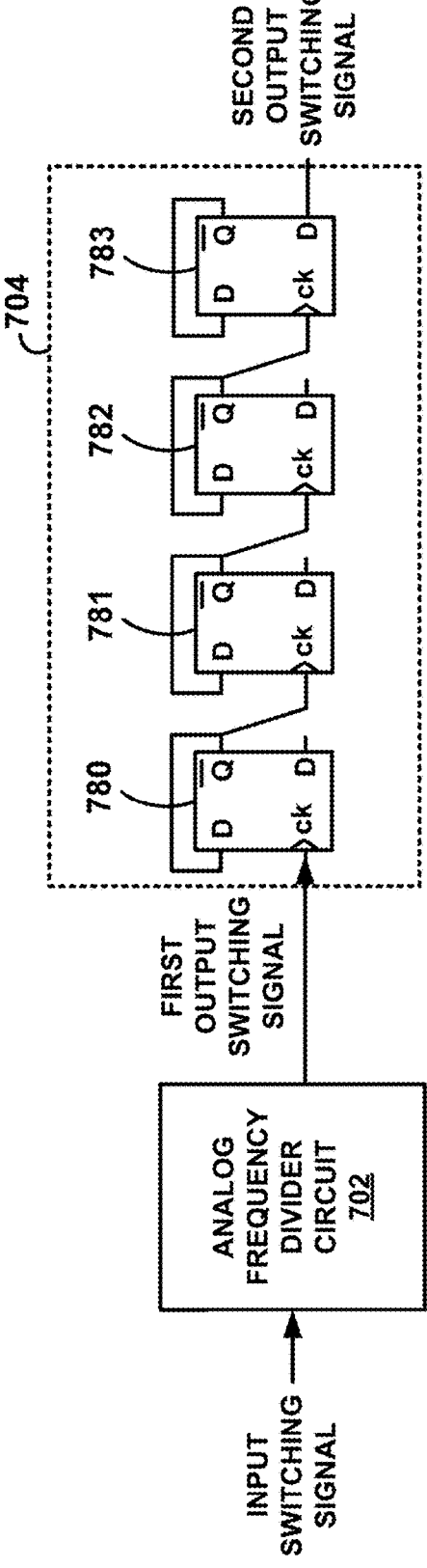
FIG. 7 is a conceptual diagram illustrating an example system for generating an output switching signal using both an analog frequency divider and a digital frequency divider, in accordance with one or more techniques of this disclosure.

FIG. 7 is a conceptual diagram illustrating an example system 700 for generating an output switching signal using both an analog frequency divider 702 and a digital frequency divider 704, in accordance with one or more techniques of this disclosure. Examples of analog frequency divider 702 may include system 100 of FIG. 1, system 400 of FIG. 4, or circuit 500 of FIG. 5. Digital frequency divider 704 includes D-Flip Flops 780-783. While FIG. 7 illustrates digital frequency divider 704 with four D-Flip Flops, other examples may include fewer than 4 D-Flip Flops or more than four D-Flip Flops.

As shown, D-Flip Flops 780-783 may be cascade connected. For example, a clock input of D-Flip Flop 781 receives an inverted output (inv Q) from a previous D-Flip Flop (e.g., D-Flip Flop 780) and outputs at the inverted output a clock input to a next D-Flip Flop (e.g., D-Flip Flop 782), where the D input of D-Flip Flop 781 is coupled to the inverted output of D-Flip Flop 781.

In the example of FIG. 7, analog frequency divider 702 may receive an input switching signal and output a first output switching signal. For instance, the first output switching signal may have a reduced frequency (e.g., reduced by the frequency division factor of Equation 5). In this example, digital frequency divider 704 may represent a set of D-flip flops (e.g., D-Flip Flops 780-783) configured to receive the first output switching signal at a clock input and to output a second output switching signal.

One or more benefits of using a combination of analog frequency divider 702 and digital frequency divider 704 may include that system 700 reduces a power consumption compared to using only D-Flip Flops. For example, the higher power consumption in a chain of D-Flip Flops may be in the first blocks which are commuting at higher frequency than subsequent blocks of the chain of D-Flip Flops. In this example, the last blocks of the chain of D-Flip Flops are commuting at lower frequency, which may consume less power than previous blocks in the chain of D-Flip Flops. Another benefit may include that the first output switching signal output by analog frequency divider 702 may be implemented to be a pulse (e.g., $S_{out}$ of FIG. 6). In this example, digital frequency divider 704 may generate the second output switching signal with both a reduced frequency and with a 50% Duty-Cycle square waveform, which may simplify an implementation of analog frequency divider 702.

Figure 8:
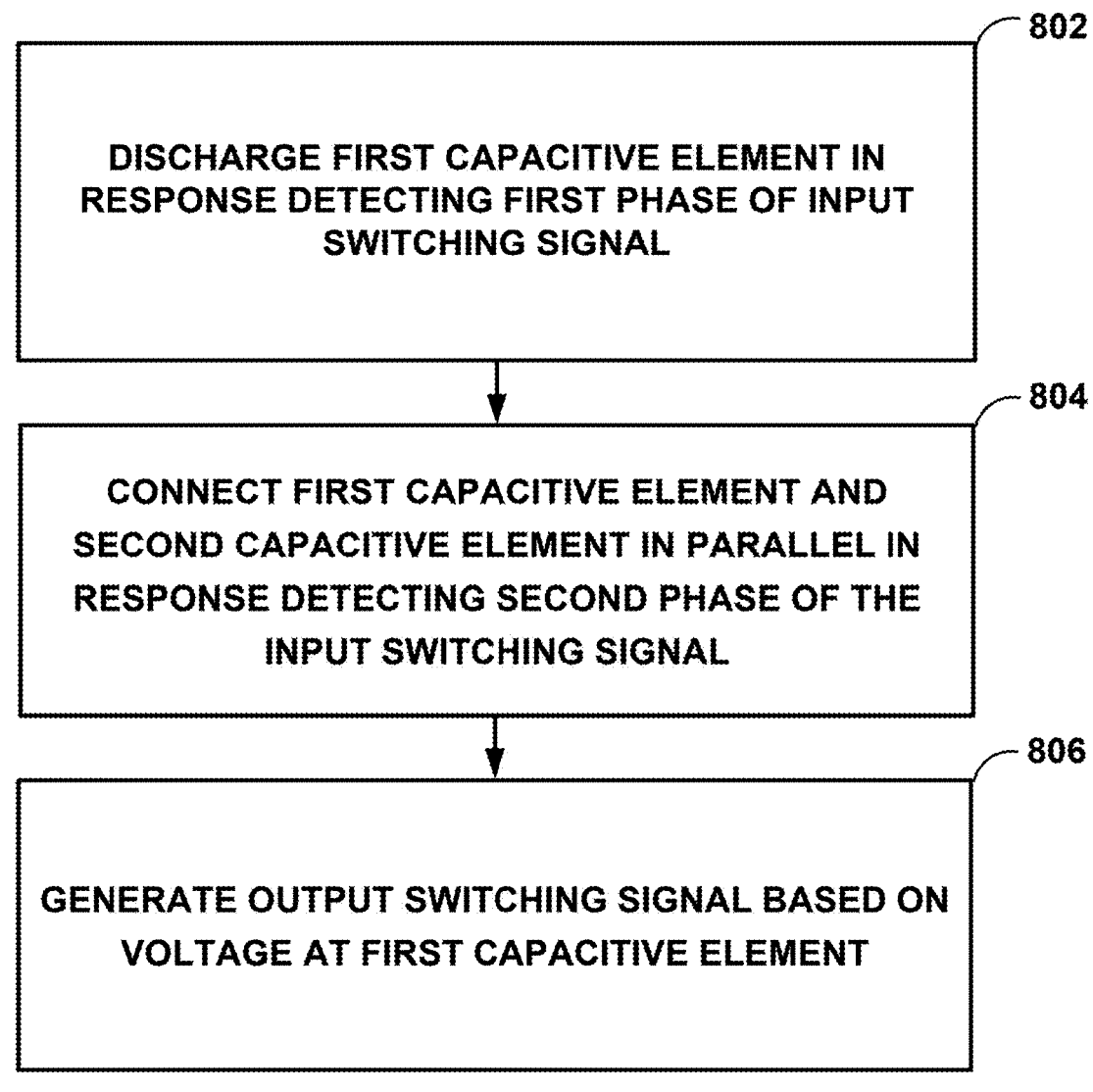
FIG. 8 is a flowchart illustrating an example process for generating an output switching signal, in accordance with one or more techniques of the disclosure.

FIG. 8 is a flowchart illustrating an example process for generating an output switching signal, in accordance with one or more techniques of the disclosure. FIG. 8 is discussed with respect to FIGS. 1-7 for example purposes only.

In some examples, switching circuitry 110 may be configured to charge (e.g., pre-charge) second capacitive element 114 to a supply voltage (e.g., $V_{DD}$). For instance, in response to a sampling phase ('S'), switching circuitry 110 may charge second capacitive element 114.

Switching circuitry 110 may discharge a first capacitive element 112 (e.g., $C_{SB}$ or $C_{SA}$) in response to detecting a first phase of an input switching signal (802). For example, switching circuitry 110 may couple nodes (e.g., a positive node and negative node) of first capacitive element 112 to a supply node (e.g., a voltage node or a ground node) in response to detecting the first phase (e.g., a logical 0 or a logical 1) of the input switching signal.

Switching circuitry 110 may connect first capacitive element 112 (e.g., $C_{SB}$ or $C_{SA}$) and a second capacitive element 114 (e.g., $C_{LB}$ or $C_{LA}$) in parallel in response to detecting a second phase of the input switching signal (804). For example, in response to detecting a second phase (e.g., a logical 1 or a logical 0) of the input switching signal, switching circuitry 110 may connect a first node (e.g., positive node) of first capacitive element 112 to a first node (e.g., a positive node) of second capacitive element 114 and connect a second node (e.g., positive node) of first capacitive element 112 to a second node (e.g., a positive node) of second capacitive element 114. In this way, a charge stored at second capacitive element 114 is transferred to first capacitive element 112, which may result in a voltage at second capacitive element 114 having an exponential behavior decay or rise.

Switching circuitry 110 may generate the output switching signal based on a voltage at second capacitive element 114 (806). For example, comparison circuitry 416 may generate the output switching signal to indicate a first phase (e.g., a logical 1) when the voltage at second capacitive element 114 is greater than a reference voltage. In this example, comparison circuitry 416 may generate the output switching signal to indicate a second phase when the voltage at second capacitive element 114 is not greater than the reference voltage. In this way, switching circuitry 110 may generate the output switching signal with a reduced frequency from the input switching signal while consuming less power compared to systems that rely solely on D-Flip Flops.

In some examples, a system may compare the voltage at second capacitive element with a voltage at two capacitive elements. As shown in the example of FIG. 4, switching circuitry 410 may be further configured to discharge third capacitive element 420 (e.g., $C_{SA}$) in response to detecting the first phase of the input switching signal. In this example, switching circuitry 410 may be configured to connect third capacitive element 420 and fourth capacitive element 422 (e.g., $C_{LA}$) in parallel in response to detecting the second phase of the input switching signal. In this way, a charge stored at fourth capacitive element 422 is transferred to third capacitive element 420, which may result in a voltage at fourth capacitive element 422 having an exponential behavior rise or decay.

Comparison circuitry 416 may be configured to generate the output switching signal based on the voltage at second capacitive element 414 and further based on a voltage at fourth capacitive element 422. For example, comparison circuitry 416 may generate the output switching signal to indicate a first phase when the voltage at second capacitive element 414 is greater than the voltage at fourth capacitive element 422. In this example, comparison circuitry 416 may generate the output switching signal to indicate a second phase when the voltage at second capacitive element 414 is not greater than the voltage at fourth capacitive element 422. Comparing voltages at two capacitive switching elements discharge using switched capacitors results in both the voltage at second capacitive element 414 and the voltage at fourth capacitive element 422 having exponential behavior, which may allow the frequency division factor to be independent on a voltage at a supply node (e.g., $V_{DD}$) and on capacitor absolute values. Allowing the frequency division factor to be independent on a voltage at a supply node (e.g., $V_{DD}$) and on capacitor absolute values may help to simplify an implementation (e.g., allow for less precise components) and/or improve an accuracy of the frequency division.

In some examples, the output switching signal, which may be referred to as a first output switching signal, may be output to a set of D-flip flops as shown in FIG. 7. In this example, the set of D-flip flops may be configured to receive the first output switching signal at a clock input and to output a second output switching signal. In this way, the set of D-flip flops may generate the second output switching signal with both a reduced frequency and with a 50% Duty-Cycle square waveform, which may improve an accuracy of the second output switching signals compared to the first output switching signals (e.g., more precise frequency control and/ or more precise duty-cycle form) and/or reduce a power consumption compared to systems using only D-flip flops.

In various examples, the techniques and circuits of this disclosure may be useful for creating long clock signals, e.g., greater than 100 milliseconds, for any of a wide variety of applications. In some specific examples, the techniques and circuits of this disclosure may be useful for creating long clock signals used to control a sample and hold operation performed by a sample and hold circuit. In some systems (such as vehicle systems) there may be several circuit elements or blocks, like reference voltage generators, that may remain active and consume a significant amount of power to produce a constant or steady voltage, e.g., even when the system is turned off. Sample and hold circuits may be useful for controlling such several circuit elements or blocks, like reference voltage generators, and the techniques of this disclosure may be useful in efficiently and effectively creating long clock signals for controlling such sample and hold circuits.

The following clauses may illustrate one or more aspects of the disclosure.

Clause 1: A circuit for generating an output switching signal, the circuit comprising: switching circuitry configured to: discharge a first capacitive element in response to detecting a first phase of an input switching signal; and connect the first capacitive element and a second capacitive element in parallel in response to detecting a second phase of the input switching signal; and comparison circuitry configured to generate the output switching signal based on a voltage at the second capacitive element.

Clause 2: The circuit of clause 1, wherein the switching circuitry is further configured to: discharge a third capacitive element in response to detecting the first phase of the input switching signal; and connect the third capacitive element and a fourth capacitive element in parallel in response to detecting the second phase of the input switching signal, wherein the comparison circuitry is configured to generate the output switching signal based on the voltage at the second capacitive element and further based on a voltage at the fourth capacitive element.

Clause 3: The circuit of clause 2, wherein to generate the output switching signal the comparison circuitry is configured to: generate the output switching signal to indicate a first phase when the voltage at the second capacitive element is greater than the voltage at the fourth capacitive element; and generate the output switching signal to indicate a second phase when the voltage at the second capacitive element is not greater than the voltage at the fourth capacitive element.

Clause 4: The circuit of clauses 1-3, wherein the first capacitive element comprises a first node and a second node; and wherein to discharge the first capacitive element the switching circuitry is configured to connect both the first node of the first capacitive element and the second node of the first capacitive element to a supply node.

Clause 5: The circuit of clause 4, wherein the supply node comprises a ground node or a voltage node.

Clause 6: The circuit of clauses 1-5, wherein the first capacitive element comprises a first node coupled to a supply node and a second node; wherein the second capacitive element comprises a first node coupled to the supply node and a second node; and wherein the switching circuitry comprises: a first switching element comprising a first node coupled to the supply node and a second node coupled to the second node of the first capacitive element; and a second switching element comprising a first node coupled to the second node of the first capacitive element and a second node coupled to the second node of the second capacitive element.

Clause 7: The circuit of clause 6, wherein the first switching element is configured to operate in an open state during the second phase of the input switching signal and to operate in a closed state during the first phase of the input switching signal; and wherein the second switching element is configured to operate in a closed state during the second phase of the input switching signal and to operate in an open state during the first phase of the input switching signal.

Clause 8: The circuit of clauses 6-7, wherein the supply node comprises a ground node or a voltage node.

Clause 9: The circuit of clauses 1, 4-8, wherein to generate the output switching signal the comparison circuitry is configured to: generate the output switching signal to indicate a first phase when the voltage at the second capacitive element is greater than a reference voltage; and generate the output switching signal to indicate a second phase when the voltage at the second capacitive element is not greater than the reference voltage.

Clause 10: The circuit of clauses 1-9, wherein the output switching signal is a first output switching signal, the circuit further comprising: a set of D-flip flops configured to receive the first output switching signal at a clock input and to output a second output switching signal.

Clause 11: The circuit of clauses 1-10, wherein the switching circuitry is configured to charge the second capacitive element to a supply voltage.

Clause 12: A system for generating an output switching signal, the system comprising: a first capacitive element; a second capacitive element; switching circuitry configured to: discharge the first capacitive element in response to detecting a first phase of an input switching signal; and connect the first capacitive element and the second capacitive element in parallel in response to detecting a second phase of the input switching signal; and comparison circuitry configured to generate the output switching signal based on a voltage at the second capacitive element.

Clause 13: The system of clause 12, wherein the switching circuitry is first switching circuitry, the circuit further comprising: a third capacitive element; a fourth capacitive element; and second switching circuitry configured to: discharge the third capacitive element in response to detecting the first phase of the input switching signal; and connect the third capacitive element and the fourth capacitive element in parallel in response to detecting the second phase of the input switching signal, wherein the comparison circuitry is configured to generate the output switching signal based on the voltage at the second capacitive element and further based on a voltage at the fourth capacitive element.

Clause 14: The system of clause 13, wherein to generate the output switching signal the comparison circuitry is configured to: generate the output switching signal to indicate a first phase when the voltage at the second capacitive element is greater than the voltage at the fourth capacitive element; and generate the output switching signal to indicate a second phase when the voltage at the second capacitive element is not greater than the voltage at the fourth capacitive element.

Clause 15: The system of clauses 12-14, wherein the second capacitive element comprises a first node and a second node; and wherein to discharge the second capacitive element the switching circuitry is configured to connect both the first node of the first capacitive element and the second node of the first capacitive element to a supply node.

Clause 16: The system of clause 15, wherein the supply node comprises a ground node or a voltage node.

Clause 17: The system of clauses 12-16, wherein the first capacitive element comprises a first node coupled to a supply node and a second node; wherein the second capacitive element comprises a first node coupled to the supply node and a second node; and wherein the switching circuitry comprises: a first switching element comprising a first node coupled to the supply node and a second node coupled to the second node of the first capacitive element; and a second switching element comprising a first node coupled to the second node of the first capacitive element and a second node coupled to the second node of the second capacitive element.

Clause 18: The system of clause 17, wherein the first switching element is configured to operate in an open state during the second phase of the input switching signal and to operate in a closed state during the first phase of the input switching signal; and wherein the second switching element is configured to operate in a closed state during the second phase of the input switching signal and to operate in an open state during the first phase of the input switching signal.

Clause 19: The system of clauses 17-18, wherein the supply node comprises a ground node or a voltage node.

Clause 20: A method for generating an output switching signal, the method comprising: discharging a first capacitive element in response to detecting a first phase of an input switching signal; connecting the first capacitive element and a second capacitive element in parallel in response to detecting a second phase of the input switching signal; and generating the output switching signal based on a voltage at the second capacitive element.

Various aspects have been described in the disclosure. These and other aspects are within the scope of the following claims.

What is claimed is:

1. A circuit for generating an output switching signal, the circuit comprising:
switching circuitry configured to:
discharge a first capacitive element in response to detecting a first phase of an input switching signal; and
connect the first capacitive element and a second capacitive element in parallel in response to detecting a second phase of the input switching signal; and
comparison circuitry configured to generate the output switching signal based on a voltage at the second capacitive element.

2. The circuit of claim 1, wherein the switching circuitry is further configured to:
discharge a third capacitive element in response to detecting the first phase of the input switching signal; and
connect the third capacitive element and a fourth capacitive element in parallel in response to detecting the second phase of the input switching signal,
wherein the comparison circuitry is configured to generate the output switching signal based on the voltage at the second capacitive element and further based on a voltage at the fourth capacitive element.

3. The circuit of claim 2, wherein to generate the output switching signal the comparison circuitry is configured to:

generate the output switching signal to indicate a first phase when the voltage at the second capacitive element is greater than the voltage at the fourth capacitive element; and generate the output switching signal to indicate a second phase when the voltage at the second capacitive element is not greater than the voltage at the fourth capacitive element.

4. The circuit of claim 1, wherein the first capacitive element comprises a first node and a second node; and wherein to discharge the first capacitive element the switching circuitry is configured to connect both the first node of the first capacitive element and the second node of the first capacitive element to a supply node.

5. The circuit of claim 4, wherein the supply node comprises a ground node or a voltage node.

6. The circuit of claim 1, wherein the first capacitive element comprises a first node coupled to a supply node and a second node;

wherein the second capacitive element comprises a first node coupled to the supply node and a second node; and wherein the switching circuitry comprises:

a first switching element comprising a first node coupled to the supply node and a second node coupled to the second node of the first capacitive element; and a second switching element comprising a first node coupled to the second node of the first capacitive element and a second node coupled to the second node of the second capacitive element.

7. The circuit of claim 6, wherein the first switching element is configured to operate in an open state during the second phase of the input switching signal and to operate in a closed state during the first phase of the input switching signal; and wherein the second switching element is configured to operate in a closed state during the second phase of the input switching signal and to operate in an open state during the first phase of the input switching signal.

8. The circuit of claim 6, wherein the supply node comprises a ground node or a voltage node.

9. The circuit of claim 1, wherein to generate the output switching signal the comparison circuitry is configured to:

generate the output switching signal to indicate a first phase when the voltage at the second capacitive element is greater than a reference voltage; and generate the output switching signal to indicate a second phase when the voltage at the second capacitive element is not greater than the reference voltage.

10. The circuit of claim 1, wherein the output switching signal is a first output switching signal, the circuit further comprising:

a set of D-flip flops configured to receive the first output switching signal at a clock input and to output a second output switching signal.

11. The circuit of claim 1, wherein the switching circuitry is configured to charge the second capacitive element to a supply voltage.

12. A system for generating an output switching signal, the system comprising:

a first capacitive element;

a second capacitive element;

switching circuitry configured to:

discharge the first capacitive element in response to detecting a first phase of an input switching signal; and connect the first capacitive element and the second capacitive element in parallel in response to detecting a second phase of the input switching signal; and comparison circuitry configured to generate the output switching signal based on a voltage at the second capacitive element.

13. The system of claim 12, wherein the switching circuitry is first switching circuitry, the circuit further comprising:

a third capacitive element;

a fourth capacitive element; and second switching circuitry configured to:

discharge the third capacitive element in response to detecting the first phase of the input switching signal; and connect the third capacitive element and the fourth capacitive element in parallel in response to detecting the second phase of the input switching signal, wherein the comparison circuitry is configured to generate the output switching signal based on the voltage at the second capacitive element and further based on a voltage at the fourth capacitive element.

14. The system of claim 13, wherein to generate the output switching signal the comparison circuitry is configured to:

generate the output switching signal to indicate a first phase when the voltage at the second capacitive element is greater than the voltage at the fourth capacitive element; and generate the output switching signal to indicate a second phase when the voltage at the second capacitive element is not greater than the voltage at the fourth capacitive element.

15. The system of claim 12, wherein the second capacitive element comprises a first node and a second node; and wherein to discharge the second capacitive element the switching circuitry is configured to connect both the first node of the first capacitive element and the second node of the first capacitive element to a supply node.

16. The system of claim 15, wherein the supply node comprises a ground node or a voltage node.

17. The system of claim 12, wherein the first capacitive element comprises a first node coupled to a supply node and a second node;

wherein the second capacitive element comprises a first node coupled to the supply node and a second node; and wherein the switching circuitry comprises:

a first switching element comprising a first node coupled to the supply node and a second node coupled to the second node of the first capacitive element; and a second switching element comprising a first node coupled to the second node of the first capacitive element and a second node coupled to the second node of the second capacitive element.

18. The system of claim 17, wherein the first switching element is configured to operate in an open state during the second phase of the input switching signal and to operate in a closed state during the first phase of the input switching signal; and wherein the second switching element is configured to operate in a closed state during the second phase of the input switching signal and to operate in an open state during the first phase of the input switching signal.

19. The system of claim 17, wherein the supply node comprises a ground node or a voltage node.

20. A method for generating an output switching signal, the method comprising:

discharging a first capacitive element in response to detecting a first phase of an input switching signal;

connecting the first capacitive element and a second capacitive element in parallel in response to detecting a second phase of the input switching signal; and generating the output switching signal based on a voltage at the second capacitive element.

* * * * *